(12) United States Patent
Park et al.

(10) Patent No.: US 11,776,916 B2
(45) Date of Patent: Oct. 3, 2023

(54) SEMICONDUCTOR PACKAGE

(71) Applicant: Samsung Electronics Co., Ltd., Suwon-si (KR)

(72) Inventors: Sang Cheon Park, Hwaseong-si (KR); Young Min Lee, Hwaseong-si (KR); Dae-Woo Kim, Seongnam-si (KR); Hyuek Jae Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 17/199,703

(22) Filed: Mar. 12, 2021

(65) Prior Publication Data

US 2022/0068829 A1     Mar. 3, 2022

(30) Foreign Application Priority Data

Sep. 3, 2020 (KR) ........................ 10-2020-0112307

(51) Int. Cl.
*H01L 23/544* (2006.01)
*H01L 23/538* (2006.01)
*H01L 25/065* (2023.01)

(52) U.S. Cl.
CPC ........ *H01L 23/544* (2013.01); *H01L 23/5385* (2013.01); *H01L 23/5386* (2013.01); *H01L 25/0657* (2013.01)

(58) Field of Classification Search
CPC ......... H01L 23/544; H01L 2223/54426; H01L 2224/8013; H01L 2224/80132; H01L 2224/0213; H01L 2224/0217; H01L 2224/08145; H01L 2224/0224; H01L 2224/2499–24998; H01L 2224/26135; H01L 2224/26165; H01L 2224/40993; H01L 2224/40998; H01L 2224/777–77756; H01L 2224/4899; H01L 2224/767–76756; H01L 2224/797–79759; H01L 2224/10135; H01L 2224/10165; H01L 2224/48993; H01L 2224/18998; H01L 2225/06593;
(Continued)

(56) References Cited

U.S. PATENT DOCUMENTS 8,222,121 B2   7/2012 Patti et al.
8,314,497 B2   11/2012 Pratt
(Continued)

*Primary Examiner* — Victor A Mandala
*Assistant Examiner* — Lawrence C Tynes, Jr.
(74) *Attorney, Agent, or Firm* — Muir Patent Law, PLLC

(57) ABSTRACT

A semiconductor package includes a substrate including a first semiconductor chip including a first wiring structure, a first bonding pad, and a first alignment key on the first wiring structure to be spaced apart in a first direction, a second semiconductor chip including a second wiring structure, a second bonding pad on the second wiring structure and connected to the first bonding pad, and a second alignment key on the second wiring structure to be spaced apart from the second bonding pad and not overlapping the first alignment key in the second direction, the first wiring structure including a first wiring pattern connected to the first bonding pad and not overlapping the first and second alignment keys in the second direction, and the second wiring structure including a second wiring pattern connected to the second bonding pad and not overlapping the first and second alignment keys in the second direction.

20 Claims, 18 Drawing Sheets

(58) Field of Classification Search
CPC ....... H01L 25/0657; H01L 2221/68309; H01L 2021/60075; B81C 2203/051; B81C 3/004; B81C 99/007
See application file for complete search history.

(56) References Cited

U.S. PATENT DOCUMENTS

| | | | |
|---|---|---|---|
| 8,802,538 B1 | 8/2014 | Liu et al. | |
| 8,809,123 B2 | 8/2014 | Liu et al. | |
| 8,957,358 B2 | 2/2015 | Wan et al. | |
| 9,142,517 B2 | 9/2015 | Liu et al. | |
| 9,355,859 B2 * | 5/2016 | Yanagisawa | H01L 21/308 |
| 9,548,290 B2 * | 1/2017 | Wakiyama | H01L 25/0657 |
| 9,793,221 B2 | 10/2017 | Kira et al. | |
| 9,893,018 B2 * | 2/2018 | Ko | H01L 25/0657 |
| 10,355,039 B2 | 7/2019 | Kotoo et al. | |
| 10,504,852 B1 * | 12/2019 | Chen | H01L 25/0657 |
| 2019/0164910 A1 * | 5/2019 | Roh | H10B 12/50 |
| 2019/0164919 A1 | 5/2019 | Hu et al. | |
| 2019/0378799 A1 | 12/2019 | Wagenleitner | |
| 2020/0006164 A1 | 1/2020 | Yu et al. | |
| 2020/0020641 A1 * | 1/2020 | Ko | H01L 21/78 |
| 2021/0143008 A1 * | 5/2021 | Ko | H01L 21/561 |

\* cited by examiner

SEMICONDUCTOR PACKAGE

CROSS-REFERENCE TO RELATED APPLICATION

This application claims priority all the benefits accruing therefrom under 35 U.S.C. § 119 from Korean Patent Application No. 10-2020-0112307, filed on Sep. 3, 2020, in the Korean Intellectual Property Office, the entire contents of which are herein incorporated by reference.

BACKGROUND

1. Technical Field

Embodiments relates to a semiconductor package.

2. Description of the Related Art

As the electronic industry becomes more highly developed, the demand for high integration of semiconductor elements increases. This causes various problems such as a decrease in process margin of an exposure process for defining fine patterns, and makes it more difficult to implement the semiconductor elements. Also, with the development of the electronic industry, the demand for high-speed of the semiconductor elements also increases. Various studies have been conducted to satisfy the demands for high integration and/or high speed of the semiconductor elements.

SUMMARY

Aspects of the present disclosure provide a semiconductor package having improved product reliability.

Embodiments are directed to a semiconductor package including a first semiconductor chip including a first wiring structure, a first bonding pad and a first alignment key provided on the first wiring structure to be spaced apart from each other in a first direction, a second semiconductor chip including a second wiring structure which is spaced from the first semiconductor chip in a second direction different from the first direction and is opposite to the first wiring structure, a second bonding pad provided on the second wiring structure and electrically connected to the first bonding pad, and a second alignment key which is provided on the second wiring structure to be spaced apart from the second bonding pad in the first direction and does not overlap the first alignment key in the second direction, wherein the first wiring structure includes a first wiring pattern which is electrically connected to the first bonding pad and does not overlap the first alignment key and the second alignment key in the second direction, and the second wiring structure includes a second wiring pattern which is electrically connected to the second bonding pad and does not overlap the first alignment key and the second alignment key in the second direction.

Embodiments are directed to a semiconductor package including a first semiconductor chip including a first wiring structure, a first passivation layer which includes a first alignment key and a first bonding pad provided on the first wiring structure to be spaced apart from each other in a first direction, a second passivation layer which is provided on the first passivation layer, and includes a second alignment key, and a second bonding pad directly joined to the first bonding pad, and a second semiconductor chip including a second wiring structure spaced apart from the first wiring structure in a second direction different from the first direction by the second passivation layer, wherein a surface on which the first alignment key and the first wiring structure are in contact forms a same plane as a surface on which the first bonding pad and the first wiring structure are in contact, a surface on which the second alignment key and the second wiring structure are in contact forms a same plane as a surface on which the second bonding pad and the second wiring structure are in contact, the first alignment key includes an alignment part, and an opening which penetrates the alignment part and exposes at least a part of the first wiring structure, and the second alignment key overlaps the opening in the second direction and does not overlap the alignment part in the second direction.

Embodiments are directed to a semiconductor package including a substrate which includes a first face including a connection pad, and a second face opposite to the first face in a first direction, a first connection terminal electrically connected to the connection pad, on the first face of the substrate, a first semiconductor chip which includes a first wiring structure on the second face of the substrate, the first wiring structure including a first wiring region in which a first wiring pattern is provided and a first alignment region in which the first wiring pattern is not provided, and a first penetration electrode electrically connected to the first connection terminal and the first wiring pattern, a first passivation layer which includes a first bonding pad provided on the first wiring pattern of the first wiring structure and electrically connected to the first wiring pattern, and a first alignment key provided on the first alignment region of the first wiring structure, a second passivation layer which includes a second bonding pad directly joined to the first bonding pad, and a second alignment key which does not overlap the first alignment key in the first direction, the second passivation layer being directly joined to the first passivation layer, and a second semiconductor chip including a second wiring structure on the second passivation layer, the second wiring structure including a second wiring region in which a second wiring pattern electrically connected to the second bonding pad is provided, and a second alignment region in which the second wiring pattern is not provided, wherein the second alignment key is provided on the second alignment region.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Figure 1:
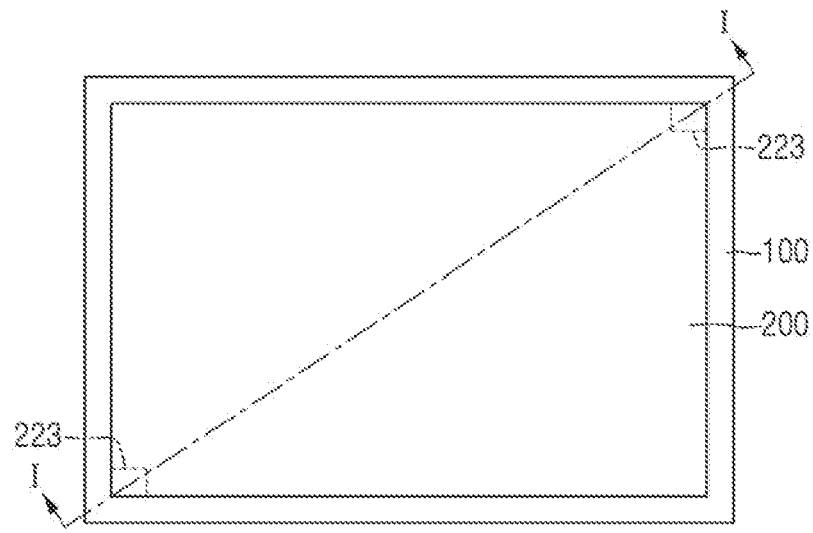
FIG. 1 is a schematic layout diagram for explaining a semiconductor package, according to example embodiments.
Figure 2:
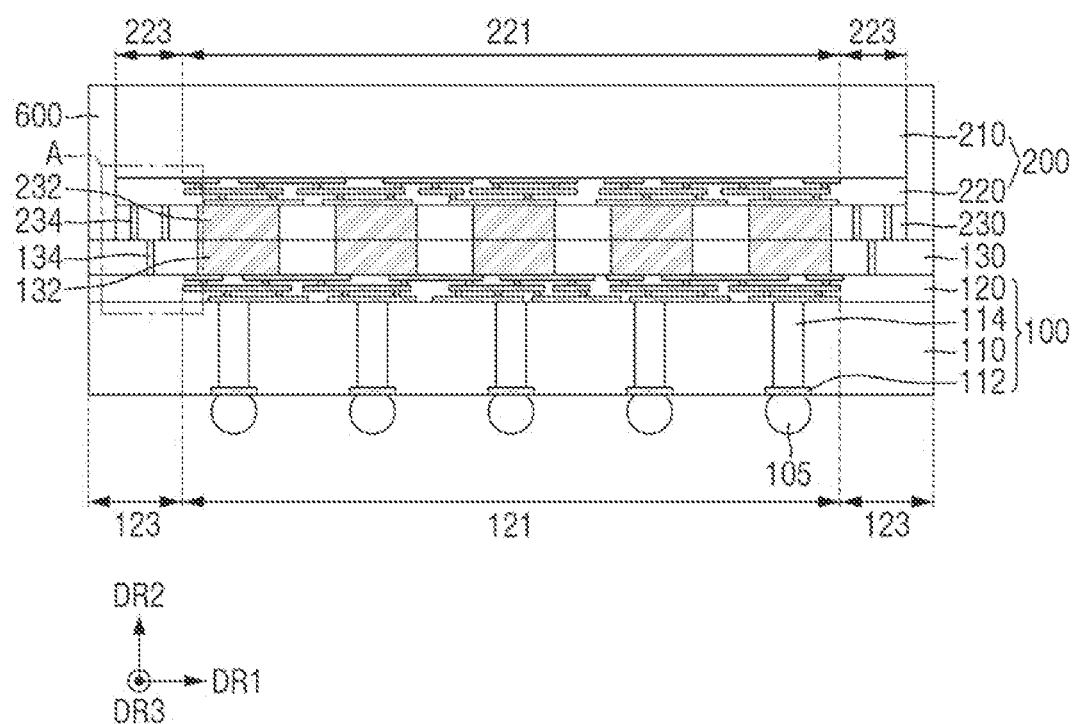
FIG. 2 is a schematic cross-sectional view taken along a line I-I of FIG. 1.
Figure 3:
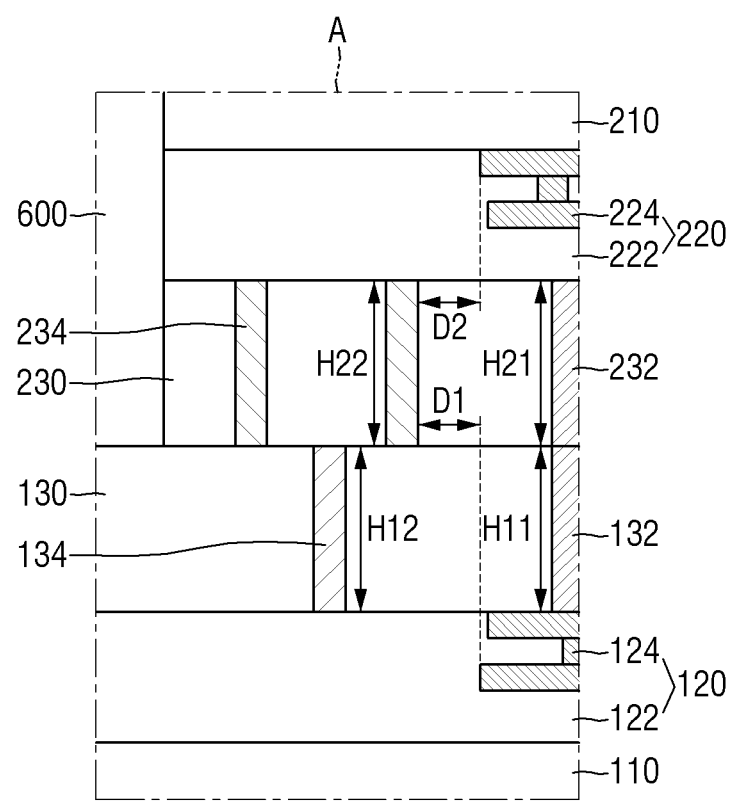
FIG. 3 is an enlarged view for explaining a region A of FIG. 2.
Figure 4:
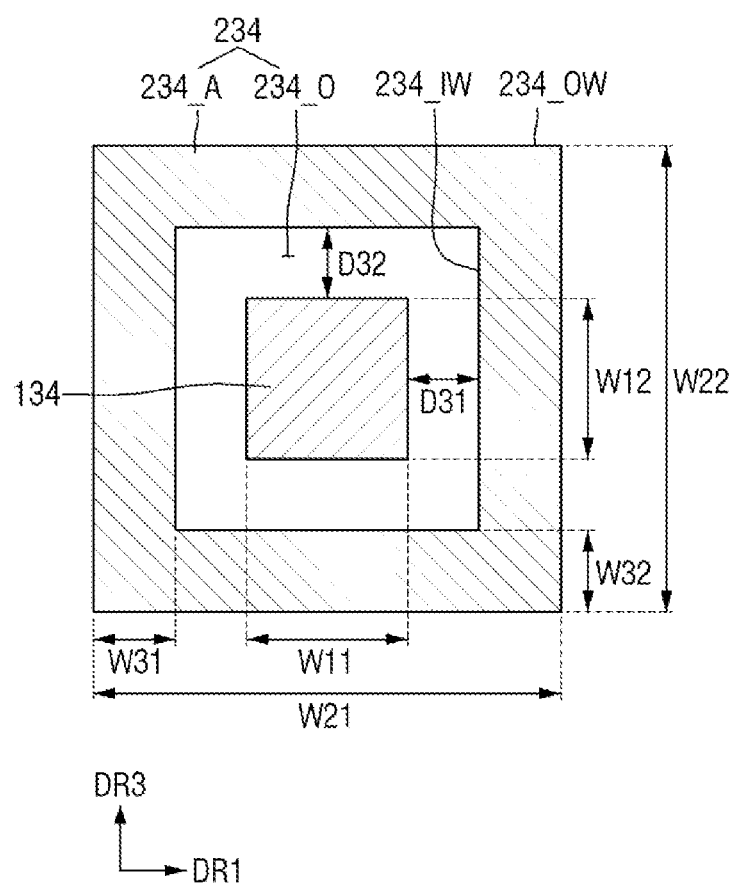
FIGS. 4 to 9 are schematic plan views of FIG. 2.

FIG. 1 is a schematic layout diagram for explaining a semiconductor package, according to example embodiments. FIG. 2 is a schematic cross-sectional view taken along a line I-I of FIG. 1. FIG. 3 is an enlarged view for explaining a region A of FIG. 2. FIGS. 4 to 9 are schematic plan views of FIG. 2. For convenience of explanation, only a first alignment key and a second alignment key of FIG. 2 are shown in FIGS. 4 to 9.

As used herein, spatially relative terms, such as "beneath," "below," "lower," "above," "upper" and the like, may be used for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Referring to FIGS. 1 to 4, the semiconductor packages, according to example embodiments may include a first semiconductor chip 100, a first passivation layer 130, a second passivation layer 230, a second semiconductor chip 200, and a mold layer 600.

The first semiconductor chip 100 and the second semiconductor chip 200 each may be a memory semiconductor chip. The memory semiconductor chip may be, for example, a volatile memory semiconductor chip such as a DRAM (Dynamic Random Access Memory) or a SRAM (Static Random Access Memory), or a non-volatile memory semiconductor chip such as a PRAM (Phase-change Random Access Memory), a MRAM (Magnetoresistive Random Access Memory), a FeRAM (Ferroelectric Random Access Memory), or a RRAM (ResistiveRandom Access Memory). The first semiconductor chip 100 may be, for example, a buffer semiconductor chip.

Or, the first semiconductor chip 100 may be a logic semiconductor chip, and the second semiconductor chip 200 may be a memory semiconductor chip. For example, the first semiconductor chip 100 may be a controller semiconductor chip that controls operations such as input and output of a second semiconductor chip 200 electrically connected to the first semiconductor chip 100.

The first semiconductor chip 100 may include a first semiconductor substrate 110, a first connection pad 112, a first penetration electrode 114, and a first wiring structure 120. The second semiconductor chip 200 may include a second semiconductor substrate 210 and a second wiring structure 220.

The first semiconductor substrate 110 and the second semiconductor substrate 210 may be, for example, bulk silicon or SOI (silicon-on-insulator), respectively. In contrast, each of the first semiconductor substrate 110 and the second semiconductor substrate 210 may be silicon substrate, or may include, but are not limited to, other materials, for example, silicon germanium, SGOI (silicon germanium on insulator), indium antimonide, lead tellurium compounds, indium arsenide, indium phosphide, gallium arsenide, or gallium antimonide.

The first connection pad 112 may be placed (or provided) on a lower face of the first semiconductor chip 100. The first connection pad 112 may be placed, for example, on a lower face of the first semiconductor substrate 110 in a second direction DR2. The first connection pad 112 may include, for example, but is not limited to, at least one of aluminum (Al), copper (Cu), nickel (Ni), tungsten (W), platinum (Pt), gold (Au), and combinations thereof.

The first connection terminal 105 may be placed (or provided) on the first connection pad 112. The first connection terminal 105 may be electrically connected to the first connection pad 112. The first connection terminal 105 may have various shapes such as, for example, a pillar structure, a ball structure, or a solder layer.

The first penetration electrode 114 may penetrate the first semiconductor substrate 110. The first penetration electrode 114 may have, for example, a pillar shape extending in the second direction DR2. The first penetration electrode 114 may be electrically connected to the first connection pad 112 and the first wiring structure 120.

The first penetration electrode 114 may include, for example, a barrier film formed on a pillar-shaped surface, and a buried conductive layer that fills the inside of the barrier film. The barrier film may include, but is not limited to, at least one of Ti, TiN, Ta, TaN, Ru, Co, Mn, WN, Ni, and NiB. The buried conductive layer may include, but is not limited to, at least one of Cu alloys such as Cu, CuSn, CuMg, CuNi, CuZn, CuPd, CuAu, CuRe and CuW, W, W alloys, Ni, Ru, and Co.

For example, an insulating film may be interposed between the first semiconductor substrate 110 and the first penetration electrode 114. The insulating film may include, but is not limited to, an oxide film, a nitride film, a carbide film, a polymer, or a combination thereof.

The first wiring structure 120 may be placed on the first semiconductor substrate 110. For example, the first wiring structure 120 may be placed on the upper face of the first semiconductor substrate 110 in the second direction DR2. The first wiring structure 120 may include a first wiring insulating film 122, and a first wiring pattern 124 in the first wiring insulating film 122. The first wiring pattern 124 may be stacked sequentially from the upper face of the first semiconductor substrate 110.

The first wiring structure 120 may include a first wiring region 121 in which the first wiring pattern 124 is placed, and a first alignment region 123 in which the first wiring pattern 124 is not placed. The first wiring region 121 may be placed between the first alignment regions 123.

In some embodiments, the first alignment region 123 may be placed adjacent to both corners of the first wiring structure 120. The first alignment region 123 may be placed at both corners of the first wiring structure 120 in the first direction DR1. The first alignment regions 123 may be placed diagonally opposite to each other. The first alignment regions 123 may be disposed apart from each other in the first direction DR1 of the first wiring structure 120. The first wiring region 121 may be placed between the first alignment regions 123 spaced apart from each other in the first direction DR1.

The first passivation layer 130 may be placed on the first wiring structure 120. The first passivation layer 130 may include a first bonding pad 132 and a first alignment key 134. A surface on which the first bonding pad 132 and the first wiring structure 120 are in contact may be placed on the same plane as a surface on which the first alignment key 134 and the first wiring structure 120 are in contact. For example, lower surfaces of the first bonding pad 132 and the first alignment key 134 may be coplanar with each other, and upper surfaces of the first bonding pad 132 and the first alignment key 134 may be coplanar with each other. The first bonding pad 132 and the first alignment key 134 may be placed, for example, on the first wiring structure 120 to be spaced apart from each other in the first direction DR1. In another way, the first passivation layer 130 may wrap the side faces of the first alignment key 134 and the side faces of the first bonding pad 132. For example, the first passivation layer 130 may surround the side faces of the first alignment key 134 and the side faces of the first bonding pad 132, and contact the side faces of the first alignment key 134 and the side faces of the first bonding pad 132.

The first bonding pad 132 may be placed on the first wiring region 121 of the first wiring structure 120. For example, the first bonding pad 132 may overlap the first wiring region 121 in the second direction DR2. The first bonding pad 132 may be electrically connected to the first wiring pattern 124.

The first alignment key 134 may be placed on the first alignment region 123 of the first wiring structure 120. For example, the first alignment key 134 may overlap the first alignment region 123 in the second direction DR2, and may not overlap the first wiring region 121. That is, the first alignment key 134 may not overlap the first wiring pattern 124 in the second direction DR2. The first alignment key 134 may be spaced apart from the first wiring pattern 124 in the first direction DR1.

In some embodiments, the first alignment key 134 may include the same material as the first bonding pad 132. A thickness H11 of the first bonding pad 132 in the second direction DR2 may be substantially the same as a thickness H12 of the first alignment key 134 in the second direction DR2.

The second semiconductor chip 200 may be placed on the first semiconductor chip 100. The second semiconductor chip 200 may be spaced apart from the first semiconductor chip 100 in the second direction DR2.

The second wiring structure 220 may be placed on the second semiconductor substrate 210. The second wiring structure 220 may be opposite to the first wiring structure 120. The second wiring structure 220 may be opposite to the first wiring structure 120, for example, in the second direction DR2. The second wiring structure 220 may include a second wiring insulating film 222, and a second wiring pattern 224 in the second wiring insulating film 222. The second wiring pattern 224 may be stacked sequentially from the lower face of the second semiconductor substrate 210.

The second wiring structure 220 may include a second wiring region 221 in which the second wiring pattern 224 is placed, and a second alignment region 223 in which the second wiring pattern 224 is not placed. The second wiring region 221 may be placed between the second alignment regions 223.

In some embodiments, the second alignment region 223 may be placed adjacent to both corners of the second wiring structure 220. The second alignment region 223 may be placed at both corners of the second wiring structure 220 in the first direction DR1. The second alignment regions 223 may be placed diagonally opposite to each other. The second alignment regions 223 may be placed apart from each other in the first direction DR1. The second wiring region 221 may be placed between the second alignment regions 223 spaced apart from each other in the first direction DR1.

The second passivation layer 230 may be placed on the second wiring structure 220. The second passivation layer 230 may be placed between the second wiring structure 220 and the first passivation layer 130. The second passivation layer 230 may include a second bonding pad 232 and a second alignment key 234. The surface on which the second bonding pad 232 is in contact with the second wiring structure 220 may be placed on the same plane as the surface on which the second alignment key 234 is in contact with the second wiring structure 220. For example, lower surfaces of the second bonding pad 232 and the second alignment key 234 may be coplanar with each other, and upper surfaces of the second bonding pad 232 and the second alignment key 234 may be coplanar with each other. The second bonding pad 232 and the second alignment key 234 may be spaced apart from each other in the first direction DR1, for example, on the second wiring structure 220. In another way, the second passivation layer 230 may wrap the side faces of the second alignment key 234 and the side faces of the second bonding pad 232. For example, the second passivation layer 230 may surround the side faces of the second alignment key 234 and the side faces of the second bonding pad 232, and contact the side faces of the second alignment key 234 and the side faces of the second bonding pad 232.

In some embodiments, the second alignment key 234 may include the same material as the second bonding pad 232. A thickness H21 of the second bonding pad 232 in the second direction DR2 may be substantially the same as a thickness H22 of the second alignment key 234 in the second direction DR2.

The second bonding pad 232 may be placed on the second wiring region 221 of the second wiring structure 220. For example, the second bonding pad 232 may overlap the second wiring region 221 in the second direction DR2. The second bonding pad 232 may be electrically connected to the second wiring pattern 224.

The second bonding pad 232 may come into direct contact with the first bonding pad 132. The first bonding pad 132 and the second bonding pad 232 may include the same metal. In some embodiments, the first bonding pad 132 and the second bonding pad 232 may include copper (Cu). The first bonding pad 132 and the second bonding pad 232 may be coupled by mutual diffusion of copper, for example, through a high-temperature annealing process. The first bonding pad 132 and the second bonding pad 232 may include materials that may be coupled to each other (for example, gold (Au)), without being limited to copper. That is, the second bonding pad 232 may be directly coupled to the first bonding pad 132.

The second passivation layer 230 may come into direct contact with the first passivation layer 130. The first passivation layer 130 and the second passivation layer 230 may include the same material. In some embodiments, the first passivation layer 130 and the second passivation layer 230 may include silicon oxide. The first passivation layer 130 and the second passivation layer 230 may be joined to each other by, for example, a high-temperature annealing process, and may have stronger bonding strength by covalent bond of silicon and oxygen. The first passivation layer 130 and the second passivation layer 230 may include an insulating material (e.g., SiCN) that may be coupled to each other, without being limited to silicon oxides. That is, the second passivation layer 230 may be directly joined to the first passivation layer 130.

Accordingly, the first semiconductor chip 100 and the second semiconductor chip 200 may be bonded. That is, the first semiconductor chip 100 and the second semiconductor chip 200 may be joined to each other by Cu—Cu hybrid bonding. Therefore, because the semiconductor package according to some embodiments does not require a gapfill process for burying a gap between the semiconductor chips, a gapfill defect can be prevented. Further, when the distance between the solder balls decreases with a decrease in the size of the semiconductor package, defects such as solder balls adjacent to each other being joined to each other may occur. However, since the semiconductor package according to some embodiments uses Cu—Cu hybrid bonding instead of the solder balls, it is possible to prevent defective joining of the solder balls, and further reduce the thickness of the semiconductor package.

The second alignment key 234 may be placed on the second alignment region 223 of the second wiring structure 220. For example, the second alignment key 234 may overlap the second alignment region 223 in the second direction DR2, and may not overlap the second wiring region 221. That is, the second alignment key 234 may not overlap the second wiring pattern 224 in the second direction DR2. The second alignment key 234 may be spaced apart from the second wiring pattern 224 in the first direction DR1.

The second wiring region 221 may be placed on the first wiring region 121, and the second alignment region 223 may be placed on the first alignment region 123. Therefore, the first alignment key 134 and the second alignment key 234 may be spaced apart from the first wiring pattern 124 and the second wiring pattern 224 in the first direction DR1. For example, the second alignment key 234 may be spaced apart from the first wiring pattern 124 by a first distance D1. The second alignment key 234 may be spaced apart from the second wiring pattern 224 by a second distance D2. The first distance D1 and the second distance D2 may be substantially the same as or different from each other.

In some embodiments, the closest distance among distances between any one of the first alignment key 134 and the second alignment key 234 and any one of the first wiring pattern 124 and the second wiring pattern 224 may be 5 µm or less. For example, the first distance D1 and the second distance D2 may be 5 µm or less.

The first alignment key 134 and the second alignment key 234 may have different shapes from each other. For example, referring to FIG. 4, the first alignment key 134 may have a quadrangular shape, and the second alignment key 234 may have a box shape including an inner wall 234_IW and an outer wall 234_OW having the quadrangular shape. In another way, the first alignment key 134 does not include an opening inside, and the second alignment key 234 may include an opening 234_O that exposes at least a part of the second wiring structure 220 inside.

The first alignment key 134 may be placed inside the inner wall 234_IW of the second alignment key 234. The first alignment key 134 may be placed inside the opening 234_O of the second alignment key 234. The first alignment key 134 and the second alignment key 234 may not overlap each other in the second direction DR2. The second alignment key 234 may be spaced apart from the first alignment key 134, and may wrap the outer periphery of the first alignment key 134, when viewed in plan view. For example, the second alignment key 234 may surround the outer periphery of the first alignment key 134.

In some embodiments, a spaced distance D31 of the first alignment key 134 and the second alignment key 234 in the first direction DR1, and a spaced distance D32 of the first alignment key 134 and the second alignment key 234 in the third direction DR3 may be 5 µm or less.

A distance W21 between the outer walls 234_OW of the second alignment key 234 in the first direction DR1 may be greater than the thickness W11 of the first alignment key 134 in the first direction DR1, and a distance W22 between the outer walls 234_OW of the second alignment key 234 in the third direction DR3 may be greater than the thickness W12 of the first alignment key 134 in the third direction DR3. The distance W21 between the outer walls 234_OW of the second alignment key 234 in the first direction DR1 may be the same as or different from the distance W22 between the outer walls 234_OW of the second alignment key 234 in the third direction DR3. The thickness W11 of the first alignment key 134 in the first direction DR1 may be the same as or different from the thickness W12 of the first alignment key 134 in the third direction DR3.

In some embodiments, the thickness W11 of the first alignment key 134 in the first direction DR1 and the thickness W12 of the first alignment key 134 in the third direction DR3 may be 5 µm or less. A distance W31 between the outer wall 234_OW and the inner wall 234_IW of the second alignment key 234 in the first direction DR1, and a distance W32 between the outer wall 234_OW and the inner wall 234_IW of the second alignment key 234 in the third direction DR3 may be 5 µm or less. The distance W21 between the outer walls 234_OW of the second alignment key 234 in the first direction DR1, and the distance W22 between the outer walls 234_OW of the second alignment key 234 in the third direction DR3 may be 20 µm or less.

When the second semiconductor chip 200 is stacked on the first semiconductor chip 100, the alignment of the first semiconductor chip 100 and the second semiconductor chip 200 may be confirmed on the basis of the first alignment key 134 and the second alignment key 234. At this time, when the first alignment key 134 and/or the second alignment key 234 and the first wiring pattern 124 and/or the second wiring pattern 224 overlap in the second direction DR2, it is difficult to confirm the alignment of the first alignment key 134 and/or the second alignment key 234 due to the first wiring pattern 124 and/or the second wiring pattern 224.

Therefore, since the alignment of the first semiconductor chip 100 and the second semiconductor chip 200 may not be confirmed in real time, the accuracy of the alignment of the first semiconductor chip 100 and the second semiconductor chip 200 was calculated on the basis of the measured data before joining or on the basis of the fracture analysis of the sample chip after joining.

However, in the semiconductor package according to example embodiments, the first alignment key 134 and the second alignment key 234 do not overlap the first wiring pattern 124 and the second wiring pattern 224 in the second direction DR2. Therefore, in the semiconductor package, when the second semiconductor chip 200 is stacked on the first semiconductor chip 100, the alignment of the first alignment key 134 and the second alignment key 234 may be confirmed. That is, by confirming the first alignment key 134 and the second alignment key from the top, the second semiconductor chip 200 can be more precisely aligned on the first semiconductor chip 100. Further, since the first alignment key 134 and the second alignment key 234 have different shapes, the first semiconductor chip 100 and the second semiconductor chip 200 may be distinguished from the first alignment key 134 and the second alignment key 234. Therefore, since the first semiconductor chip 100 and the second semiconductor chip 200 are more precisely aligned and bonded in the semiconductor package, the product reliability may be improved.

The mold layer 600 may be placed on the upper face of the first semiconductor chip 100. The mold layer 600 may cover the side wall of the second semiconductor chip 200. Although FIG. 2 shows that the mold layer 600 is placed on the same plane as the upper face of the second semiconductor chip 200, the present disclosure is not limited thereto. In some other embodiments, the mold layer 600 may cover the upper face of the second semiconductor chip 200.

Figure 5:
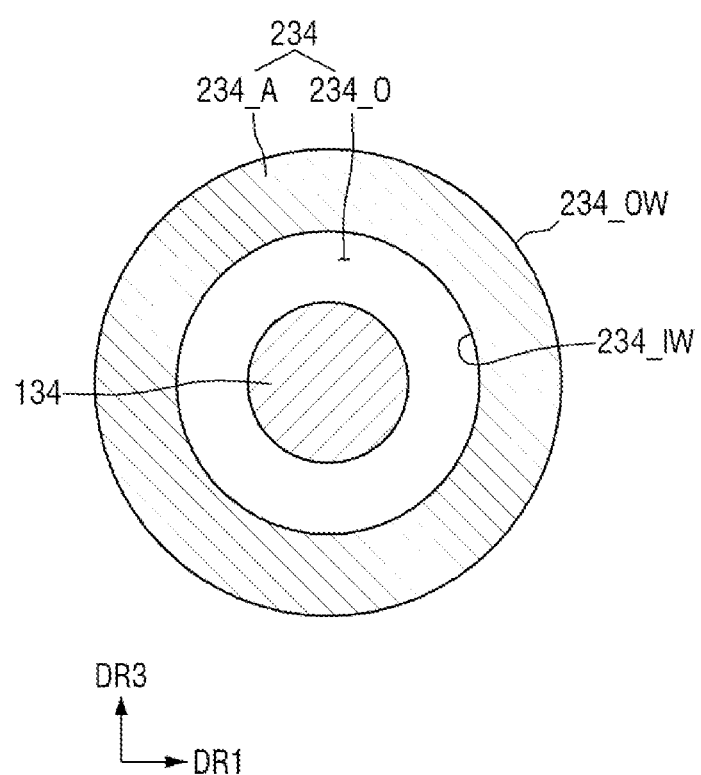

Referring to FIG. 5, the first alignment key 134 may have a circular shape. The second alignment key 234 may have an annular shape. The second alignment key 234 may include the outer wall 234_OW and the inner wall 234_IW of the circular shape, and the first alignment key 134 may be placed on the inner wall 234_IW of the second alignment key 234.

Figure 6:
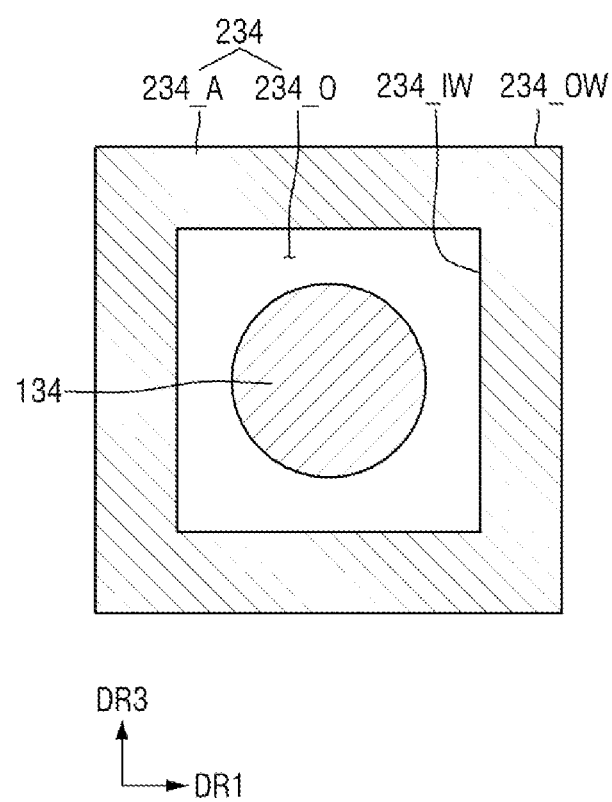

Referring to FIG. 6, the first alignment key 134 may have a circular shape. The second alignment key 234 may have a box shape including an inner wall 234_IW and an outer wall 234_OW having a quadrangular shape, and the first alignment key 134 may be placed inside the inner wall 234_IW of the second alignment key 234.

Figure 7:
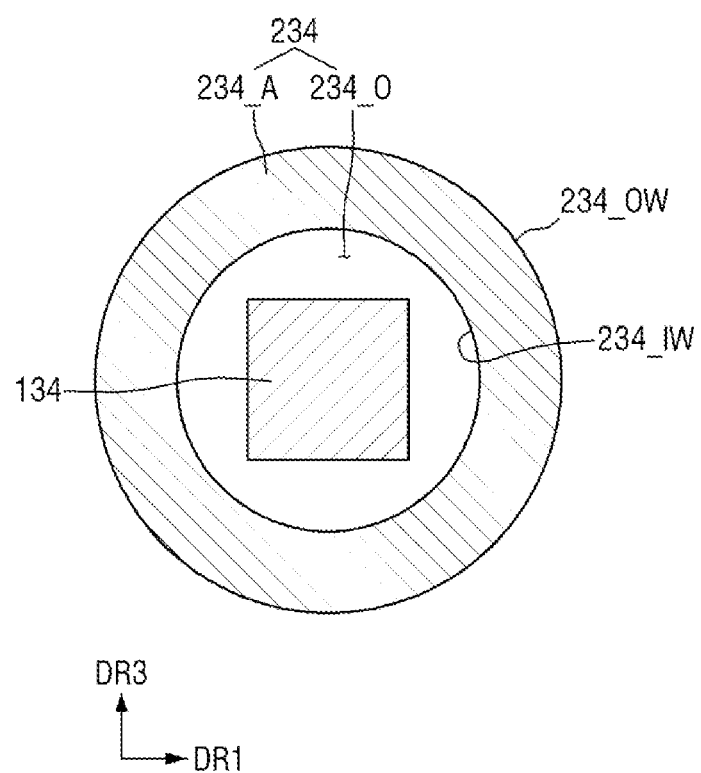

Referring to FIG. 7, the first alignment key 134 may have a quadrangular shape. The second alignment key 234 may have an annular shape. The second alignment key 234 may include an outer wall 234_OW and an inner wall 234_IW of a circular shape, and the first alignment key 134 may be placed in the inner wall 234_IW of the second alignment key 234.

Figure 8:
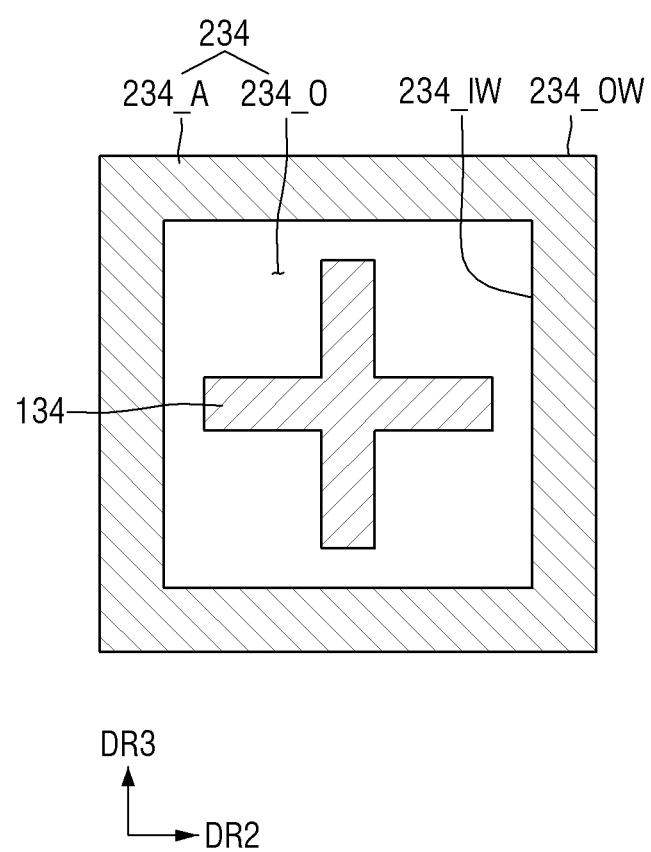

Referring to FIG. 8, the first alignment key 134 may have a cross shape. The second alignment key 234 may have a box shape including an inner wall 234_IW and an outer wall 234_OW having a quadrangular shape, and the first alignment key 134 may be placed in the inner wall 234_IW of the second alignment key 234.

Figure 9:
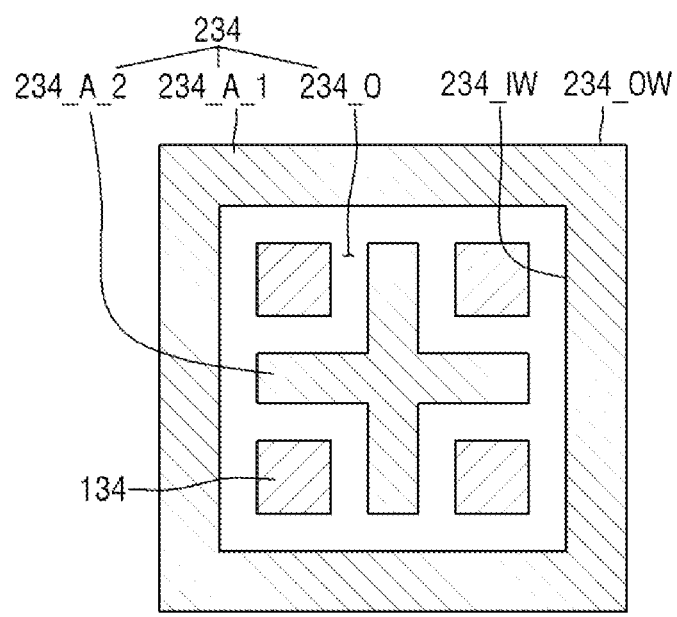

Referring to FIG. 9, the second alignment key 234 may include a first part 234A_1 of a box shape including an inner wall 234_IW and an outer wall 234_OW having the quadrangular shape, and a second part 234A_2 having a cross shape inside the inner wall 234_IW The first alignment key 134 may include a plurality of first alignment keys 134 of the quadrangular shape. The first alignment keys 134 may be placed in the space defined by the first part 234A_1 and the second part 234A_2 of the first second alignment key 234, respectively. The shapes of the first alignment key 134 and the second alignment key 234 are not limited thereto, and may, of course, have various shapes.

FIGS. 10 to 13 are enlarged schematic views for explaining a region A of FIG. 2. For convenience of explanation, differences from contents explained referring to FIGS. 1 to 9 will be mainly explained.

Figure 10:
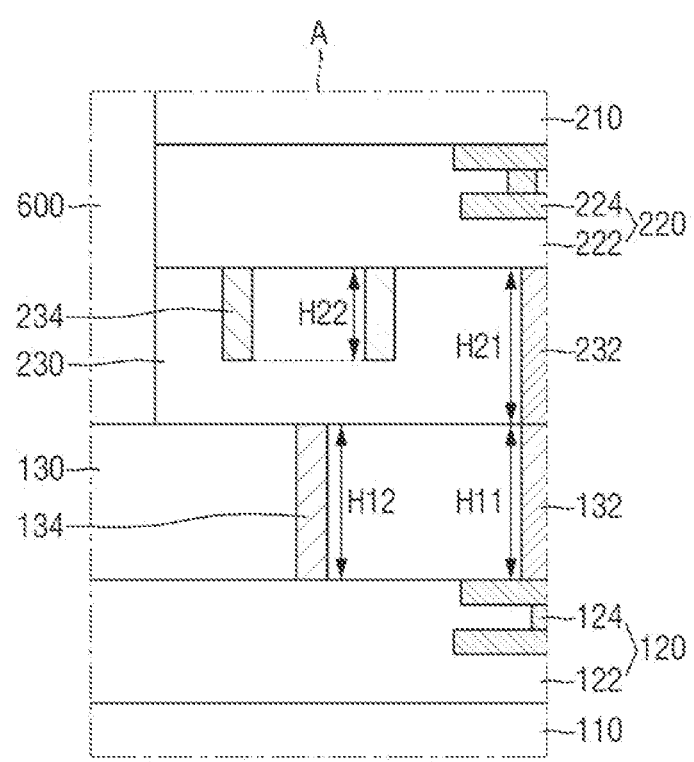
FIGS. 10 to 13 are enlarged views for explaining a region A of FIG. 2.

Referring to FIG. 10, in the semiconductor package according to some example embodiment, the second alignment key 234 may include a different material from the second bonding pad 232. The second alignment key 234 may include, for example, a metallic material different from the second bonding pad 232.

The thickness H21 of the second bonding pad 232 in the second direction DR2 may be different from the thickness H22 of the second alignment key 234 in the second direction DR2. The thickness H21 of the second bonding pad 232 in the second direction DR2 may be greater than, for example, the thickness H22 of the second alignment key 234 in the second direction DR2. Therefore, the second passivation layer 230 may surround the side faces of the second alignment key 234 and the lower face thereof in the second direction DR2.

The second alignment key 234 may include a different material from the first alignment key 134. The thickness H22 of the second alignment key 234 in the second direction DR2 may be different from the thickness H12 of the first alignment key 134 in the second direction DR2. The thickness H22 of the second alignment key 234 in the second direction DR2 may be smaller than the thickness H12 of the first alignment key 134 in the second direction DR2.

Figure 11:
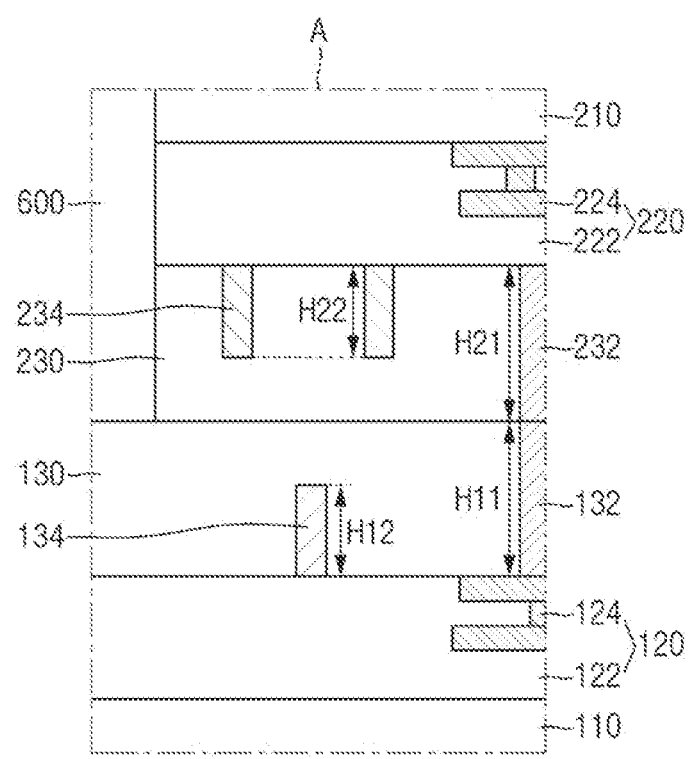

Referring to FIG. 11, in the semiconductor package according to some example embodiment, the first alignment key 134 may include a different material from the first bonding pad 132. The first alignment key 134 may include, for example, a metallic material different from the first bonding pad 132.

The thickness H11 of the first bonding pad 132 in the second direction DR2 may be different from the thickness H12 of the first alignment key 134 in the second direction DR2. The thickness H11 of the first bonding pad 132 in the second direction DR2 may be greater than, for example, the thickness H12 of the first alignment key 134 in the second direction DR2. Therefore, the first passivation layer 130 may surround the side faces of the first alignment key 134 and the upper face in the second direction DR2.

The first alignment key 134 may include the same material as the second alignment key 234. For example, the thickness H12 of the first alignment key 134 in the second direction DR2 may be substantially the same as the thickness H22 of the second alignment key 234 in the second direction DR2. In still another example, the thickness H12 of the first alignment key 134 in the second direction DR2 may be different from the thickness H22 of the second alignment key 234 in the second direction DR2.

Figure 12:
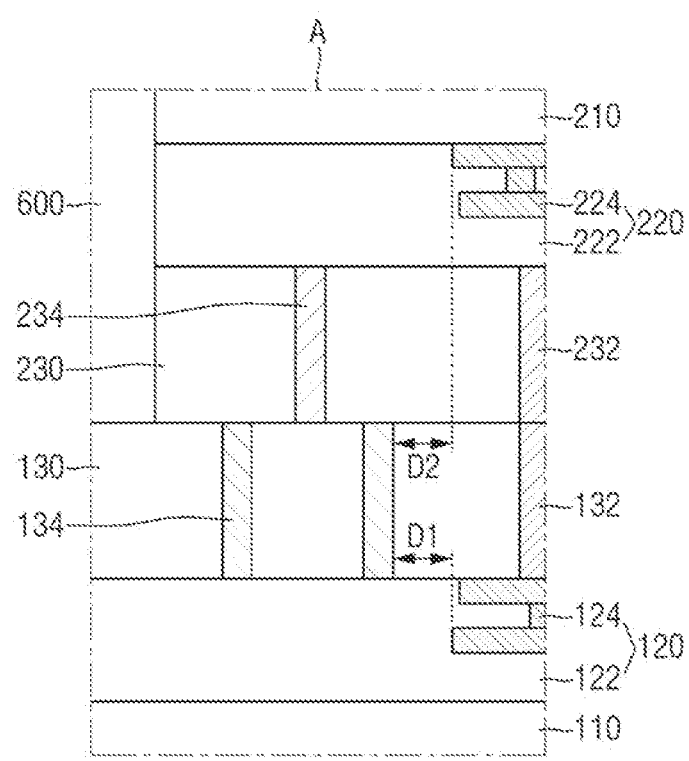

Referring to FIG. 12, in the semiconductor package according to example embodiments, the first alignment key 134 may be spaced apart from the second alignment key 234, and may surround the outer periphery of the second alignment key 234, when viewed in plan view. The first alignment key 134 and the second alignment key 234 may have shapes opposite to those explained in FIGS. 4 to 9. That is, the first alignment key 134 of FIG. 12 may have the shape of the second alignment key 234 explained in FIGS. 4 to 9, and the second alignment key 234 of FIG. 12 may have the shape of the first alignment key 134 explained in FIGS. 4 to 9.

Figure 13:
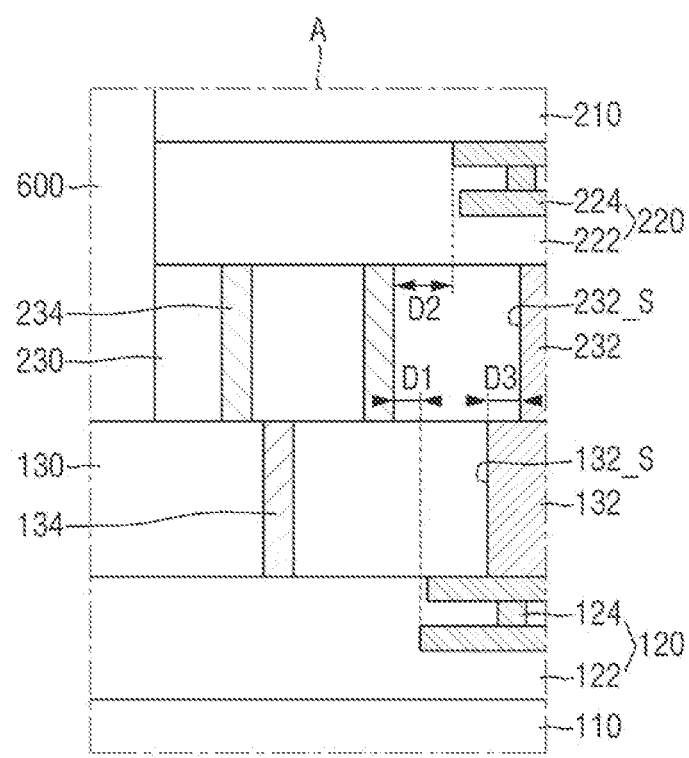

Referring to FIG. 13, the second bonding pad 232 may be placed on the first bonding pad 132. One side wall 232_S of the second bonding pad 232 may not be placed on the same plane as one side wall 132_S of the first bonding pad 132. That is, one side wall 232_S of the second bonding pad 232 may be spaced apart from one side wall 132_S of the first bonding pad 132 by a third distance D3. Although FIG. 13 shows that one side wall 232_S of the second bonding pad 232 protrudes from one side wall 132_S of the first bonding pad 132, the present disclosure is not limited thereto. In some example embodiments, one side wall 132_S of the first bonding pad 132 may protrude from one side wall 232_S of the second bonding pad 232.

In some embodiments, the third distance D3 may be 2.5 µm or less.

Figure 14:
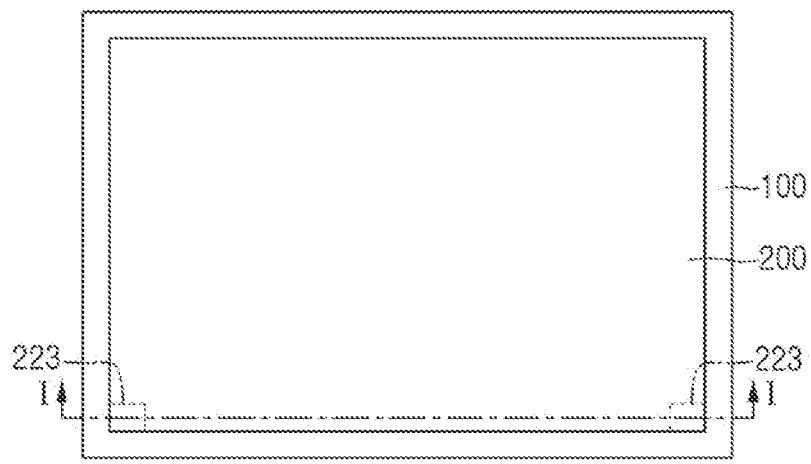
FIGS. 14 and 15 are schematic layout diagrams for explaining a semiconductor package, according to example embodiments.
Figure 15:
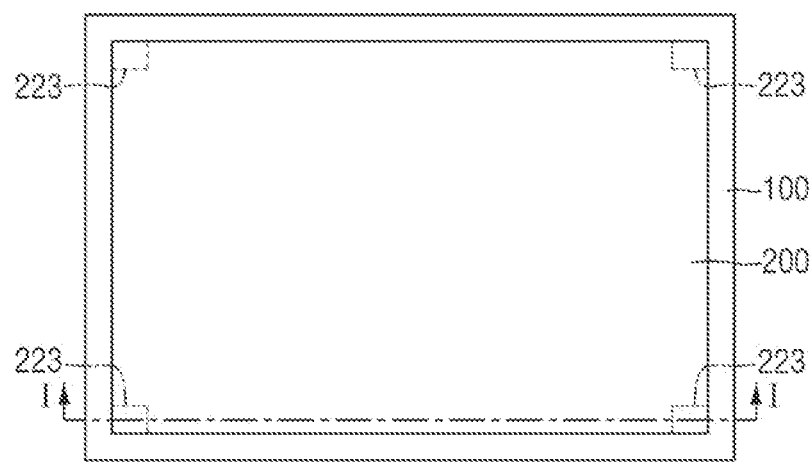

FIGS. 14 and 15 are schematic layout diagrams for explaining a semiconductor package according to some example embodiments. For convenience of explanation, differences from contents explained using FIGS. 1 to 13 will be mainly explained.

Referring to FIGS. 1, 2, 3 and 14, the second alignment regions 223 are placed opposite to each other in a length direction or a thickness direction of the second semiconductor chip 200. The first alignment regions 123 may also be placed opposite to each other in the length direction or the thickness direction of the first semiconductor chip 100. The first alignment region 123 may be placed on the second alignment region 223.

Referring to FIGS. 1, 2, 3 and 15, the second alignment region 223 may be placed at the corners of the second semiconductor chip 200, respectively. The first alignment region 123 may also be placed at corners of the first semiconductor chip 100, respectively. The first alignment region 123 may be placed on the second alignment region 223.

Figure 16:
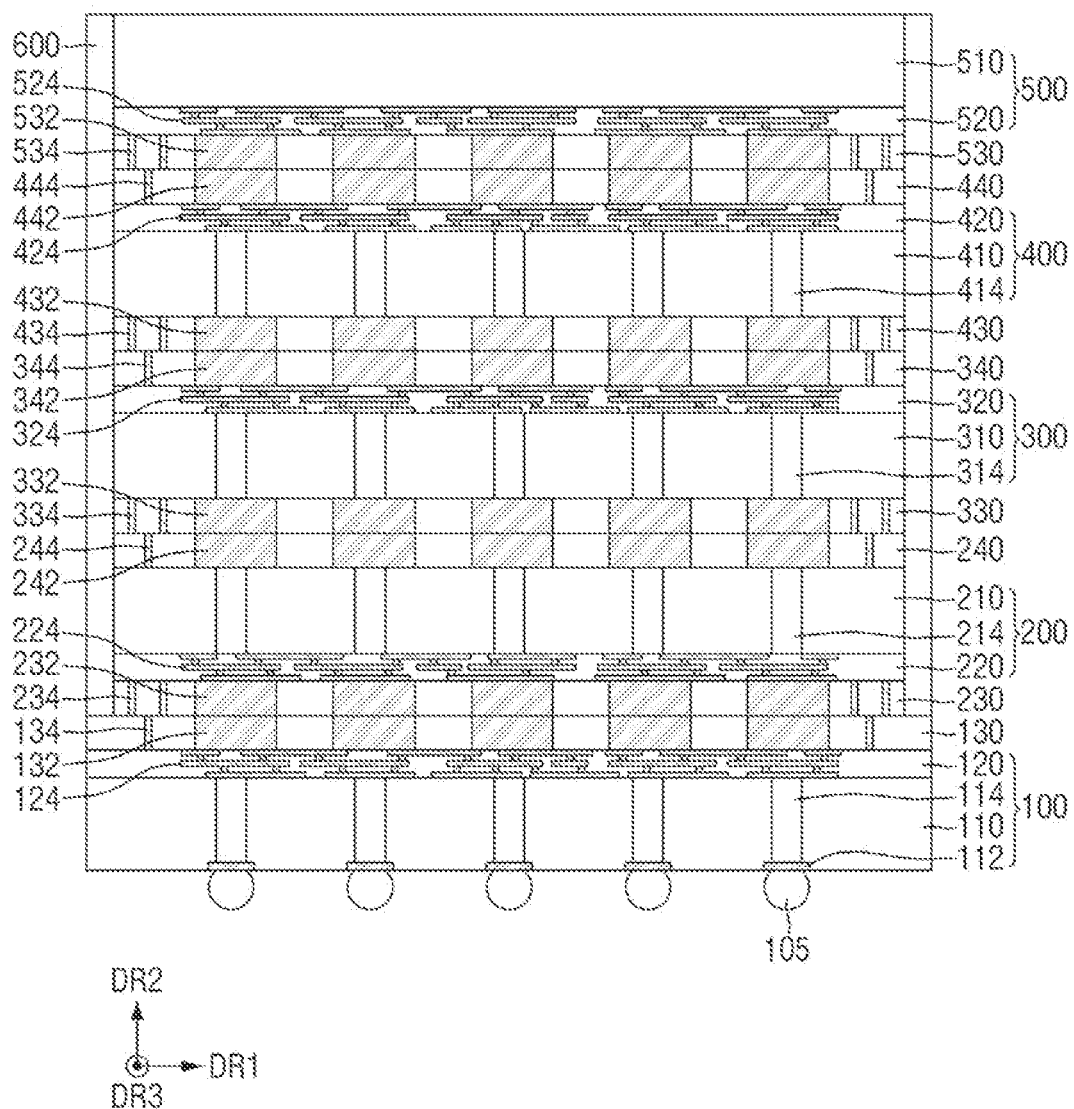
FIG. 16 is a cross-sectional view for explaining a semiconductor package, according to embodiments.

FIG. 16 is a cross-sectional view for explaining a semiconductor package according to some example embodiments. For convenience of explanation, differences from contents explained referring to FIGS. 1 to 15 will be mainly explained.

Referring to FIG. 16, the semiconductor packages according to some example embodiments may further include a second semiconductor chip 200, a second front passivation layer 230, a second back passivation layer 240, a third semiconductor chip 300, a third front passivation layer 330, a third back passivation layer 340, a fourth semiconductor chip 400, a fourth front passivation layer 430, a fourth back passivation layer 440, a fifth semiconductor chip 500, and a fifth front passivation layer 530.

The first to fifth semiconductor chips 100, 200, 300, 400 and 500 may be memory semiconductor chips. The memory semiconductor chip may be, for example, a volatile memory semiconductor chip such as a DRAM (Dynamic Random Access Memory) or a SRAM (Static Random Access Memory), or a non-volatile memory semiconductor chip such as a PRAM (Phase-change Random Access Memory), a MRAM (Magnetoresistive Random Access Memory), a FeRAM (Ferroelectric Random Access Memory), or a RRAM (ResistiveRandom Access Memory). The first semiconductor chip 100 may be, for example, a buffer semiconductor chip.

Or, the first semiconductor chip 100 may be a logic semiconductor chip, and the second to fifth semiconductor chips 200, 300, 400 and 500 may be memory semiconductor chips. The first semiconductor chip 100 may be a controller semiconductor chip that controls operations such as input and output of the second semiconductor chip 200 electrically connected to the first semiconductor chip 100.

The second back passivation layer 240 may be placed on the second semiconductor chip 200. The second back passivation layer 240 may be opposite to the second front passivation layer 230. The second back passivation layer 240 may include a second back bonding pad 242 and a second back alignment key 244. The second back bonding pad 242 may be electrically connected to the second penetration electrode 214 that penetrates the second semiconductor substrate 210. The second back alignment key 244 may not overlap the second wiring pattern 224 in the second direction DR2.

The third front passivation layer 330 may be placed on the second back passivation layer 240. The third front passivation layer 330 may include a third front bonding pad 332 and a third front alignment key 334. The third front bonding pad 332 may be directly joined to the second back bonding pad 242. The third front passivation layer 330 may be directly joined to the second back passivation layer 240.

The third front alignment key 334 may not overlap the second back alignment key 244 in the second direction DR2. The third front alignment key 334 is separated from the second back alignment key 244 in the first direction DR1, and may surround the outer periphery of the second back alignment key 244, when viewed in plan view.

The third semiconductor chip 300 may be placed on the third front passivation layer 330. The third semiconductor chip 300 may include a third semiconductor substrate 310, a third penetration electrode 314, and a third wiring structure 320.

The third penetration electrode 314 may penetrate the third semiconductor substrate 310. The third penetration electrode 314 may connect the third front bonding pad 332 and the third wiring pattern 324.

The third wiring structure 320 may be placed on the third semiconductor substrate 310. The third wiring structure 320 may include a third wiring pattern 324. The third wiring pattern 324 may be stacked sequentially from the upper face of the third semiconductor substrate 310.

The third back passivation layer 340 may be placed on the third wiring structure 320. The third back passivation layer 340 may include a third back bonding pad 342 and a third back alignment key 344. The third back bonding pad 342 may be electrically connected to the third penetration electrode 314 that penetrates the third semiconductor substrate 310. The third back alignment key 344 may not overlap the third wiring pattern 324 in the second direction DR2.

The fourth front passivation layer 430 may be placed on the third back passivation layer 340. The fourth front passivation layer 430 may include a fourth front bonding pad 432 and a fourth front alignment key 434. The fourth front bonding pad 432 may be directly joined to the third back bonding pad 342. The fourth front passivation layer 430 may be directly joined to the third back passivation layer 340.

The fourth front alignment key 434 may not overlap the third back alignment key 344 in the second direction DR2. The fourth front alignment key 434 is spaced apart from the third back alignment key 344 in the first direction DR1, and may surround the outer periphery of the third back alignment key 344, when viewed in plan view.

The fourth semiconductor chip 400 may be placed on the fourth front passivation layer 430. The fourth semiconductor chip 400 may include a fourth semiconductor substrate 410, a fourth penetration electrode 414, and a fourth wiring structure 420.

The fourth penetration electrode 414 may penetrate the fourth semiconductor substrate 410. The fourth penetration electrode 414 may connect the fourth front bonding pad 432 and the fourth wiring pattern 424.

The fourth wiring structure 420 may be placed on the fourth semiconductor substrate 410. The fourth wiring structure 420 may include a fourth wiring pattern 424. The fourth wiring patterns 424 may be sequentially stacked from the upper face of the fourth semiconductor substrate 410.

The fourth back passivation layer 440 may be placed on the fourth wiring structure 420. The fourth back passivation layer 440 may include a fourth back bonding pad 442 and a fourth back alignment key 444. The fourth back bonding pad 442 may be electrically connected to the fourth penetration electrode 414 that penetrates the fourth semiconductor substrate 410. The fourth back alignment key 444 may not overlap the fourth wiring pattern 424 in the second direction DR2.

The fifth front passivation layer 530 may be placed on the fourth back passivation layer 440. The fifth front passivation layer 530 may include a fifth front bonding pad 532 and a fifth front alignment key 534. The fifth front bonding pad 532 may be directly joined to the fourth back bonding pad 442. The fifth front passivation layer 530 may be directly joined to the fourth back passivation layer 440.

The fifth front alignment key 534 may not overlap the fourth back alignment key 444 in the second direction DR2. The fifth front alignment key 534 is spaced apart from the fourth back alignment key 444 in the first direction DR1 and surrounds the outer periphery of the fourth back alignment key 444, when viewed in plan view. Although FIG. 16 shows that the alignment keys 234, 334, 434 and 534 placed at the upper part are spaced apart from the alignment keys 134, 234, 344 and 444 placed at the lower part and surround the alignment keys 134, 234, 344 and 444 placed at the lower part, the disclosure is not limited thereto. In some example embodiments, the alignment keys 134, 234, 344 and 444 placed at the lower part are spaced apart from the alignment keys 234, 334, 434 and 534 placed at the upper part, and may surround the outer periphery of the alignment keys 234, 334, 434 and 534 placed at the upper part, when viewed in plan view.

The fifth semiconductor chip 500 may be placed on the fifth front passivation layer 530. The fifth semiconductor chip 500 may include a fifth semiconductor substrate 510 and a fifth wiring structure 520.

The fifth wiring structure 520 may include a fifth wiring pattern 524. The fifth wiring patterns 524 may be sequentially stacked from the lower face of the fifth semiconductor substrate 510.

The mold layer 600 may be placed on the upper face of the first semiconductor chip 100. The mold layer 600 may cover the side walls of the second to fifth semiconductor chips 200, 300, 400 and 500. Although FIG. 16 shows that the mold layer 600 is placed on the same plane as the upper face of the fifth semiconductor chip 500, the present disclosure is not limited thereto. In some example embodiments, the mold layer 600 may cover the upper face of the fifth semiconductor chip 500.

Figure 17:
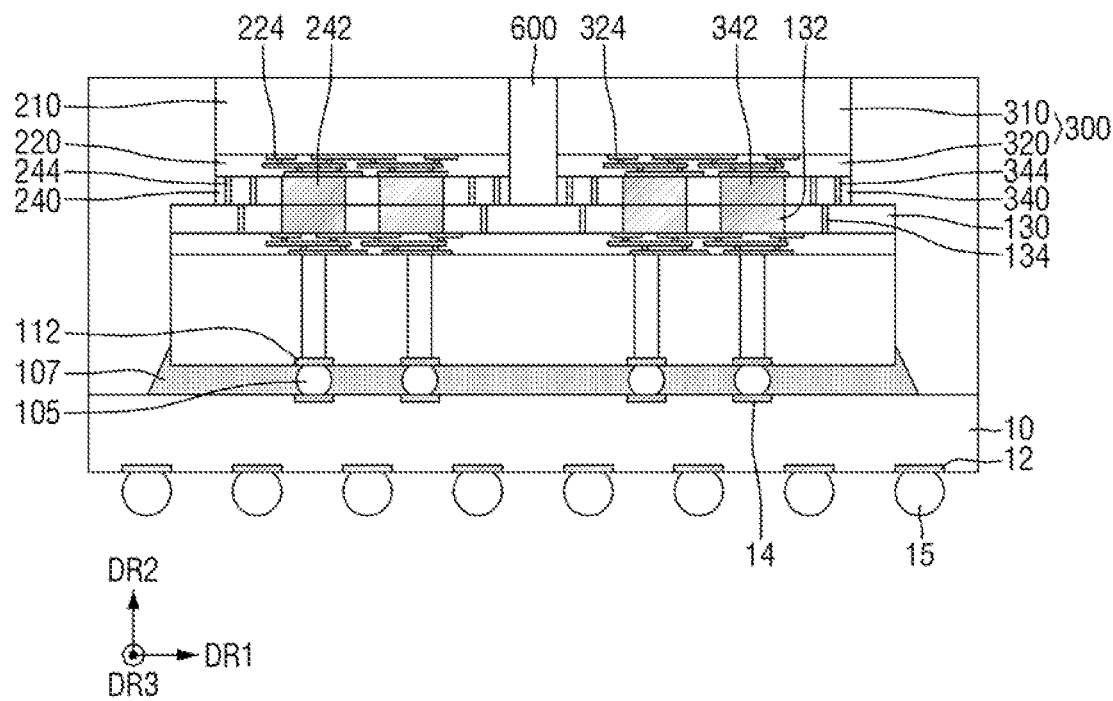
FIG. 17 is a cross-sectional view for explaining a semiconductor package, according to example embodiments.

FIG. 17 is a cross-sectional view for explaining a semiconductor package according to some example embodiments. For convenience of explanation, differences from contents explained referring to FIGS. 1 to 15 will be mainly explained.

Referring to FIG. 17, the semiconductor package according to some example embodiment may further include a third semiconductor chip 300 and a third passivation layer 340.

The third semiconductor chip 300 may be placed on the first semiconductor chip 100 to be spaced apart from the second semiconductor chip 200. The third semiconductor chip 300 may be spaced apart from the second semiconductor chip 200, for example, in the first direction DR1.

The third semiconductor chip 300 may include a third semiconductor substrate 310 and a third wiring structure 320. The third wiring structure 320 may be opposite to the first wiring structure 120. The third wiring structure 320 may be opposite to the first wiring structure 120, for example, in the second direction DR2. The third wiring structure 320 may include a third wiring pattern 324. The third wiring patterns 324 may be sequentially stacked from the lower face of the third semiconductor substrate 310.

The third passivation layer 340 may be placed on the third wiring structure 320. The third passivation layer 340 may be placed between the third wiring structure 320 and the first passivation layer 130. The third passivation layer 340 may include a third bonding pad 342 and a third alignment key 344.

The third bonding pad 342 may be directly joined to the first bonding pad 132. The third passivation layer 340 may be directly joined to the first passivation layer 130. As a result, the third semiconductor chip 300 and the first semiconductor chip 100 may be bonded.

The first alignment keys 134 may be placed to be spaced apart from each other in the first direction DR1. The first alignment keys 134 may be spaced from each other with the first bonding pad 132 interposed between them. The first alignment key 134 may not overlap the first wiring pattern 124 in the second direction DR2.

The second alignment key 244 and the third alignment key 344 may not overlap the first alignment keys 134 in the second direction DR2. The second alignment key 244 may not overlap the first wiring pattern 124 and the second wiring pattern 224 in the second direction DR2. The third alignment key 344 may not overlap the first wiring pattern 124 and the third wiring pattern 324 in the second direction DR2.

In some embodiments, from a planar viewpoint (or plan view), the second alignment key 244 and the third alignment key 344 are spaced apart from the corresponding first alignment key 134, and may surround the outer periphery of the corresponding first alignment key 134. Although FIG. 17 shows that the second alignment key 244 and the third alignment key 344 are spaced apart from the corresponding first alignment key 134 and surround the outer periphery of the corresponding first alignment key 134, the disclosure is not limited thereto. In some example embodiments, the first alignment keys 134 are spaced apart from the second alignment key 244 and the third alignment key 344, and may surround around the outer periphery of the second alignment key 244 and the outer periphery of the third alignment key 344.

In addition, the semiconductor package of FIG. 17 may further include a substrate 10. The substrate 10 may be a packaging substrate. For example, the substrate 10 may be a printed circuit board (PCB) or a ceramic substrate. However, the present disclosure is not limited thereto.

First substrate pads 12 may be placed on the lower face of the substrate 10. The second substrate pads 14 may be placed on the upper face of the substrate 10. The first substrate pads 12 and the second substrate pads 14 may include, for example, but are not limited to, metallic materials such as copper (Cu) or aluminum (Al).

The substrate 10 may be mounted on a mother board or the like of an electronic device. For example, third connection terminals 15 connected to the substrate 10 may be formed. The substrate 10 may be mounted on the mother board or the like of an electronic device through the third connection terminal 15.

A second underfill material layer 107 may be placed between the first semiconductor chip 100 and the substrate 10. The second underfill material layer 107 may fill the space between the first semiconductor chip 100 and the substrate 10. Further, the second underfill material layer 107 may surround the first connection terminals 105.

Figure 18:
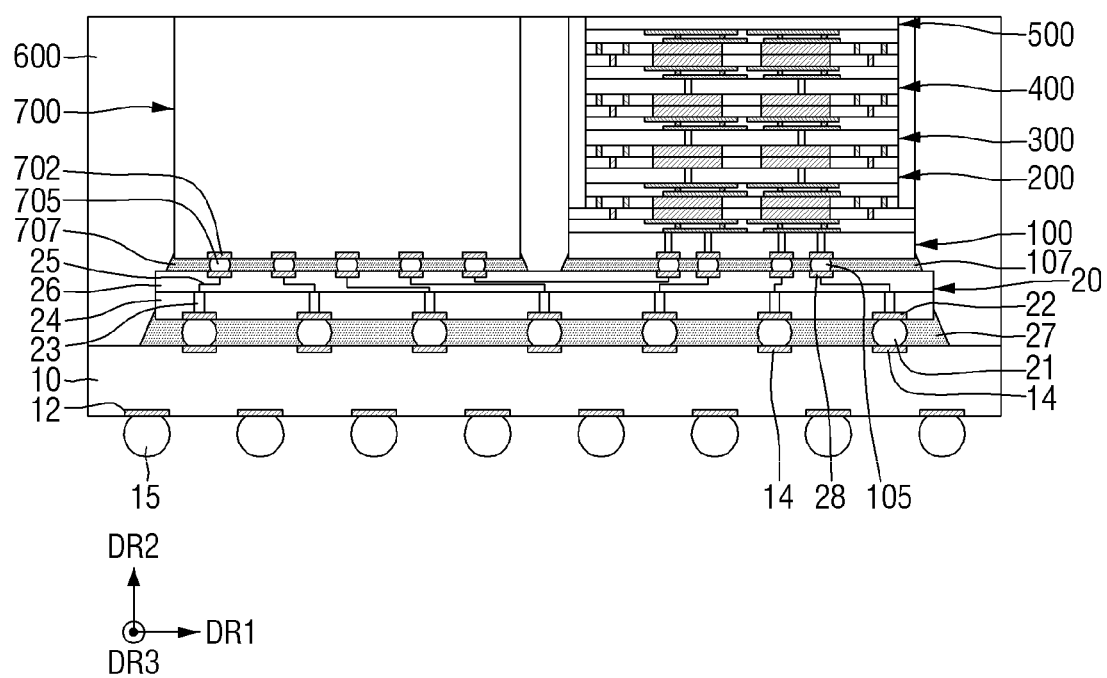
FIG. 18 is a cross-sectional view for explaining a semiconductor package, according to example embodiments.

FIG. 18 is a cross-sectional view for explaining a semiconductor package according to some example embodiments. For convenience of explanation, differences from contents explained referring to FIG. 16 will be mainly explained.

Referring to FIG. 18, the semiconductor package according to some example embodiment may further include a substrate 10, an interposer 20, and a sixth semiconductor chip 700.

The substrate 10 may be a packaging substrate. For example, the substrate 10 may be a printed circuit board (PCB) or a ceramic substrate. However, the present disclosure is not limited thereto.

The first substrate pad 12 may be placed on the lower face of the substrate 10. The second substrate pad 14 may be placed on the upper face of the substrate 10. The first substrate pad 12 and the second substrate pad 14 may include, for example, but are not limited to, metallic materials such as copper (Cu) or aluminum (Al).

The substrate 10 may be mounted on a mother board or the like of an electronic device. For example, a third connection terminal 15 connected to the substrate 10 may be formed. The substrate 10 may be mounted on the mother board or the like of an electronic device through the third connection terminal 15.

The interposer 20 may be placed on the upper face of the substrate 10. The interposer 20 may be, for example, but is not limited to, a silicon interposer. The interposer 20 may facilitate the connection between the substrate 10 and first to sixth semiconductor chips 100, 200, 300, 400, 500 and 700 to be described below, and prevent warpage of the semiconductor package. The interposer 20 may be mounted on the upper face of the substrate 10. For example, fourth connection terminals 21 may be formed between the substrate 10 and the interposer 20. The fourth connection terminals 21 may connect the second substrate pad 14 and the first interposer pad 22. As a result, the substrate 10 and the interposer 20 may be electrically connected to each other.

A first underfill material layer 27 may be placed between the substrate 10 and the interposer 20. The first underfill material layer 27 may fill a space between the substrate 10 and the interposer 20. Further, the first underfill material layer 27 may surround the fourth connection terminals 21. The first underfill material layer 27 may prevent cracking or the like of the interposer 20 by fixing the interposer 20 onto the substrate 10. The first underfill material layer 27 may include, but is not limited to, an insulating polymeric material such as EMC (epoxy molding compound).

The interposer 20 may include first interposer pads 22 and second interposer pads 28. The first interposer pads 22 and the second interposer pads 28 may each be used to electrically connect the interposer 20 to other components. For example, the first interposer pads 22 may be exposed from the lower face of the interposer 20, and the second interposer pads 28 may be exposed from the upper face of the interposer 20. The first interposer pads 22 and the second interposer pads 28 may include, for example, but are not limited to, metallic materials such as copper (Cu) or aluminum (Al). Wiring patterns for electrically connecting the first interposer pads 22 and the second interposer pads 28 may be formed in the interposer 20.

The interposer 20 may include a penetration via 23, a semiconductor film 24, a redistribution pattern 25, and an interlayer insulating film 26.

The semiconductor film 24 may be, for example, but is not limited to, a silicon film. The penetration via 23 may penetrate the semiconductor film 24. For example, the penetration via 23 extends from the upper face of the semiconductor film 24 and may be connected to the first interposer pad 22.

The interlayer insulating film 26 may cover the upper face of the semiconductor film 24. The interlayer insulating film 26 may include, for example, but is not limited to, at least one of silicon oxide, silicon nitride, silicon oxynitride and a low-k material having a lower dielectric constant than silicon oxide. The redistribution pattern 25 may be formed in the interlayer insulating film 26. The redistribution pattern 25 may electrically connect the penetration via 23 and the second interposer pad 28.

The first to fifth semiconductor chips 100, 200, 300, 400 and 500 stacked sequentially with the sixth semiconductor chip 700 may be mounted on the interposer 20. For example, the first connection terminals 105 may be formed between the interposer 20 and the first semiconductor chip 100. The first connection terminals 105 may connect some of a plurality of second interposer pads 28 and the first connection pads 112. The interposer 20 and the first semiconductor chip 100 may be electrically connected accordingly. For example, second connection terminals 705 may be formed between the interposer 20 and the sixth semiconductor chip 700. The second connection terminals 705 may connect some others of the plurality of second interposer pads 28 and the second connection pads 702. The interposer 20 and the sixth semiconductor chip 700 may be electrically connected accordingly.

A part of the redistribution pattern 25 may electrically connect the first connection terminals 105 and the second connection terminals 705. For example, a part of the redistribution pattern 25 may connect the second interposer pads 28 connected to the first connection terminals 105 and the second connection pads 702 connected to the second connection terminals 705. The first semiconductor chip 100 and the sixth semiconductor chip 700 may be electrically connected accordingly.

A second underfill material layer 107 may be placed between the first semiconductor chip 100 and the interposer 20. The second underfill material layer 107 may fill the space between the first semiconductor chip 100 and the interposer 20. Further, the second underfill material layer 107 may surround the first connection terminals 105. A third underfill material layer 707 may be placed between the sixth semiconductor chip 700 and the interposer 20. The third underfill material layer 707 may fill the space between the sixth semiconductor chip 700 and the interposer 20. Also, the third underfill material layer 707 may surround the second connection terminals 705.

The first connection terminals 105, the second connection terminals 705, the third connection terminals 15, and the fourth connection terminals 21 may have, for example, various shapes such as a pillar structure, a ball structure or a solder layer. The first connection terminals 105, the second connection terminals 705, the third connection terminals 15, and the fourth connection terminals 21 may have, for example, the same size as or different sizes from each other. For example, the sizes of the first connection terminals 105 and the second connection terminals 705 may be substantially the same, and may be smaller than the sizes of the third connection terminals 15 and the fourth connection terminals 21. The size of the fourth connection terminals 21 may be smaller than the size of the third connection terminals 15.

The sixth semiconductor chip 700 may be an integrated circuit (IC) in which hundreds to millions or more semiconductor elements are integrated in a single chip. For example, the sixth semiconductor chip 700 may be, but is not limited to, an application processor (AP) such as a CPU (Central Processing Unit), a GPU (Graphic Processing Unit), a FPGA (Field-Programmable Gate Array), a digital signal processor, an encryption processor, a microprocessor, and a microcontroller. For example, the sixth semiconductor chip 700 may be a logic chip such as an ADC (Analog-Digital Converter) or an ASIC (Application-Specific IC), and may be a memory chip such as a volatile memory (e.g., a DRAM) or a non-volatile memory (e.g., a ROM or a flash memory). Also, the sixth semiconductor chip 700 may, of course, be formed by combination thereof.

Figure 19:
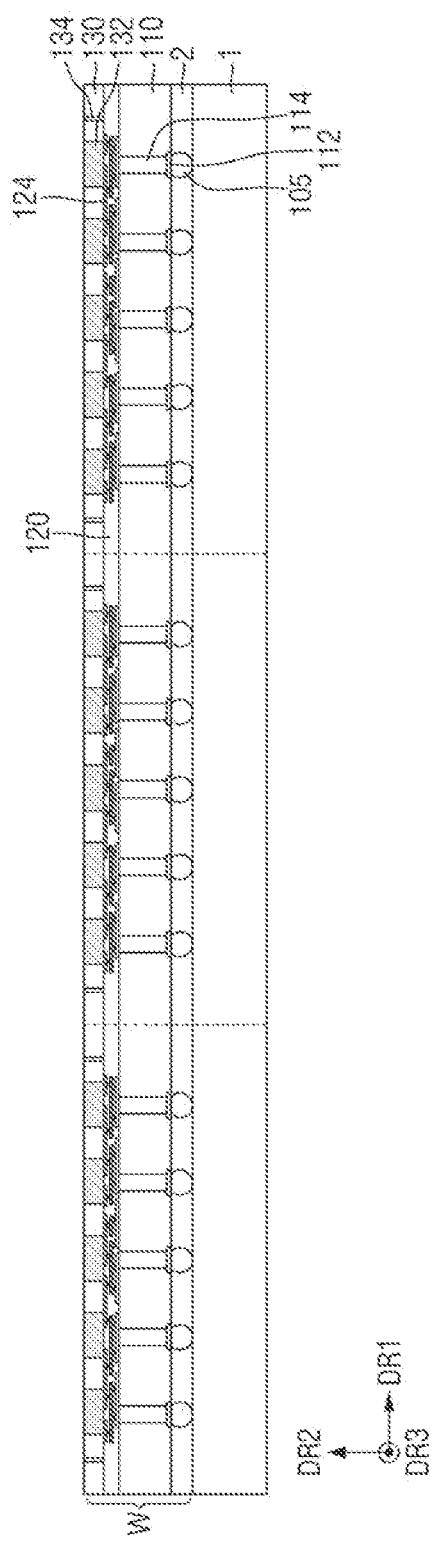
FIGS. 19 to 21 are intermediate stage diagrams for explaining a method for fabricating a semiconductor package, according to example embodiments.
Figure 20:
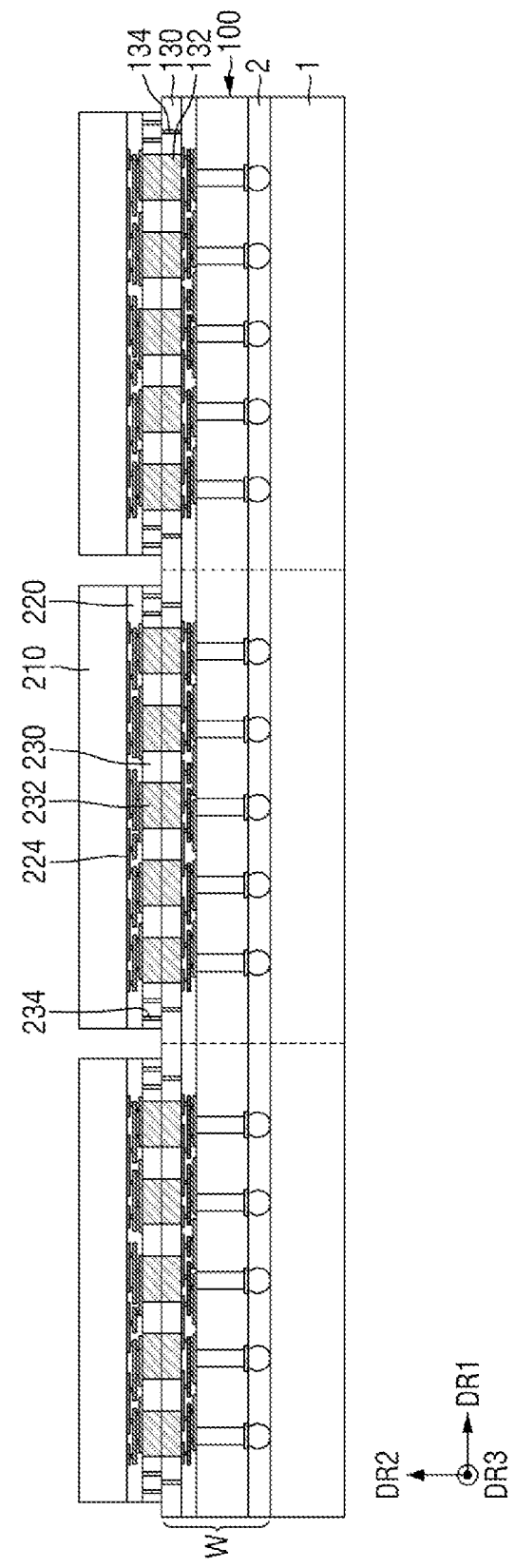
Figure 21:
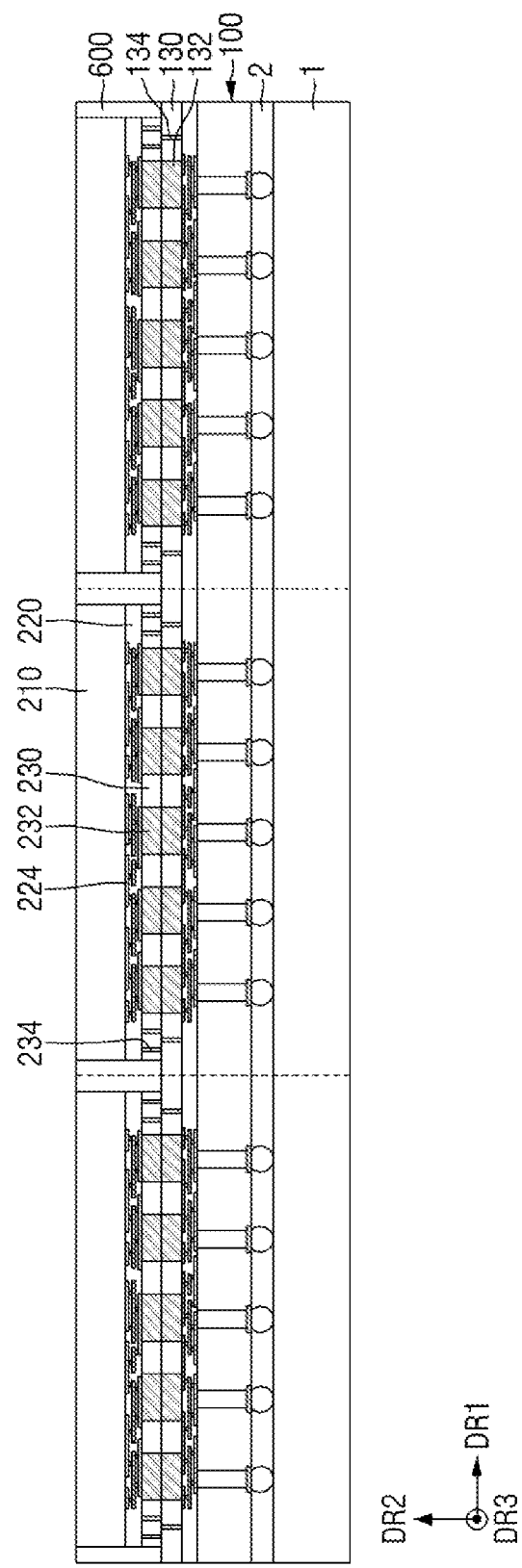

FIGS. 19 to 21 are intermediate stage diagrams for explaining a method for fabricating a semiconductor package, according to example embodiments.

Referring to FIG. 19, a wafer W, which includes the first semiconductor substrate 110 including the first connection pad 112 and the first wiring structure 120, and the first passivation layer 130 placed on the first semiconductor substrate 110, may be formed. The first wiring structure 120 may be formed to include the first wiring insulating film 122 and the first wiring pattern 124 in the first wiring insulating film 122, and the first passivation layer 130 may be formed to include the first bonding pads 132 and the first alignment keys 134. The first penetration electrodes 114 may be formed to penetrate the first semiconductor substrate 110. The first connection terminal 105 may be formed on the first connection pad 112. Although FIGS. 19 to 21 show that the first semiconductor chip 100 is formed on the wafer W, the present disclosure is not limited thereto. In some example embodiments, an interposer may be formed on the wafer W.

The wafer W on which the first connection terminal 105 is formed is attached onto the carrier substrate 1. The wafer W may be attached onto the carrier substrate 1 so that the first connection terminal 105 faces the carrier substrate 1. The wafer W may be attached onto the carrier substrate 1 by the adhesive layer 2. The adhesive layer 2 may surround the first connection terminal 105.

Subsequently, referring to FIG. 20, a second semiconductor chip 200 having the second passivation layer 230 formed on the lower face may be formed on the first passivation layer 130. The second semiconductor chip 200 may include the second wiring structure 220. The second wiring structure 220 may be formed to include the second wiring insulating film 222 and the second wiring pattern 224 in the second wiring insulating film 222, and the second passivation layer 230 may be formed to include the second bonding pads 232 and the second alignment keys 234. At this time, the second semiconductor chip 200 may be aligned on the wafer W on the basis of the first alignment keys 134 included in the first passivation layer 130 and the second alignment keys 234 included in the second passivation layer 230. Since the first alignment keys 134 do not overlap the first wiring pattern 124 and the second alignment keys 234 do not overlap the second wiring pattern 224, the alignment of the first alignment keys 134 and the second alignment keys 234 may be confirmed. For example, when the first alignment key 134 is spaced apart from the second alignment key 234 and surrounds the outer periphery of the second alignment key 234, by confirming whether the second alignment key 234 of the second semiconductor chip 200 is placed in the first alignment key 134 of the first semiconductor chip 100, using an infrared camera, the alignment of the second semiconductor chip 200 and the first semiconductor chip 100 can be confirmed, and the second semiconductor chip 200 can be aligned on the wafer W on the basis thereof.

Subsequently, the first bonding pad 132 and the second bonding pad 232 may be directly joined, using a high-temperature annealing process or the like, and the first passivation layer 130 and the second passivation layer 230 may be directly joined.

Subsequently, referring to FIG. 21, the mold layer 600 may be formed on the first semiconductor chip 100. The mold layer 600 may be placed on the upper face of the first semiconductor chip 100, and may surround the side faces of the second semiconductor chip 200.

Subsequently, referring to FIG. 1, the first semiconductor chip 100 may be cut and the carrier substrate 1 and the adhesive layer 2 may be removed to form a semiconductor package.

When joining the wafer onto the wafer to form a semiconductor package, since it is difficult to select and join only bad dies, the wafer may also be joined onto bad dies. Therefore, the yield of the fabricating process of the semiconductor package may be reduced. When the die is joined onto the die to form a semiconductor package, since a good die may be selected and the die may be joined, the yield of the fabricating process of the semiconductor package may be enhanced. However, since the die is joined onto the die, the productivity may be reduced.

The semiconductor package according to example embodiments may be formed by joining the die onto the wafer. When the die is joined onto the wafer, since the good dies are selected and attached to the wafer, the yield and productivity of the fabricating process of the semiconductor package may be further improved or enhanced.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor package comprising:
   a first semiconductor chip including a first wiring structure;
   a first bonding pad and a first alignment key provided on the first wiring structure to be spaced apart from each other in a first direction;
   a second semiconductor chip including a second wiring structure which is spaced apart from the first semiconductor chip in a second direction different from the first direction and is opposite to the first wiring structure;
   a second bonding pad provided on the second wiring structure and electrically connected to the first bonding pad; and
   a second alignment key which is provided on the second wiring structure to be spaced apart from the second bonding pad in the first direction and does not overlap the first alignment key in the second direction, wherein the first wiring structure includes a first wiring pattern which is electrically connected to the first bonding pad and does not overlap the first alignment key and the second alignment key in the second direction, wherein the second wiring structure includes a second wiring pattern which is electrically connected to the second bonding pad and does not overlap the first alignment key and the second alignment key in the second direction, wherein a lower surface of the first bonding pad is coplanar with a lower surface of the first alignment key, and wherein an upper surface of the first bonding pad contacts a lower surface of the second bonding pad.

2. The semiconductor package of claim 1, wherein the first alignment key is spaced apart from the second alignment key and surrounds an outer periphery of the second alignment key from a planar viewpoint.

3. The semiconductor package of claim 2, wherein the first alignment key has an annular shape, and the second alignment key has a circular shape.

4. The semiconductor package of claim 2,
wherein the first alignment key has a box shape including an inner wall and an outer wall of a quadrangular shape, and
wherein the second alignment key has a quadrangular shape and is provided inside the inner wall of the first alignment key.

5. The semiconductor package of claim 1, wherein the first alignment key includes the same material as the first bonding pad.

6. The semiconductor package of claim 5, wherein a thickness of the first alignment key in the second direction is substantially the same as a thickness of the second alignment key in the second direction.

7. The semiconductor package of claim 1, wherein the first alignment key includes a material different from the first bonding pad.

8. The semiconductor package of claim 7, wherein a thickness of the first alignment key in the second direction is different from a thickness of the first bonding pad in the second direction.

9. The semiconductor package of claim 7,
wherein the second bonding pad includes the same material as the first bonding pad, and
wherein the second alignment key includes a material different from the second bonding pad.

10. The semiconductor package of claim 9, wherein a thickness of the second alignment key in the second direction is different from a thickness of the second bonding pad in the second direction.

11. The semiconductor package of claim 1,
wherein the first semiconductor chip further includes a first penetration electrode which penetrates the first semiconductor chip and is electrically connected to the first wiring structure, and
wherein the second semiconductor chip further includes a second penetration electrode which penetrates the second semiconductor chip and is electrically connected to the second wiring structure.

12. The semiconductor package of claim 11,
wherein the first alignment key includes a first sub-alignment key and a second sub-alignment key spaced apart from each other in the first direction, and wherein the first penetration electrode is provided between the first sub-alignment key and the second sub-alignment key.

13. A semiconductor package comprising:
a first semiconductor chip including a first wiring structure;
a first passivation layer which includes a first alignment key and a first bonding pad provided on the first wiring structure to be spaced apart from each other in a first direction;
a second passivation layer which is provided on the first passivation layer, and includes a second alignment key, and a second bonding pad directly joined to the first bonding pad; and
a second semiconductor chip including a second wiring structure spaced apart from the first wiring structure in a second direction different from the first direction by the second passivation layer,
wherein a surface on which the first alignment key and the first wiring structure are in contact forms a same plane as a surface on which the first bonding pad and the first wiring structure are in contact,
wherein a surface on which the second alignment key and the second wiring structure are in contact forms a same plane as a surface on which the second bonding pad and the second wiring structure are in contact,
wherein the first alignment key includes an alignment part, and an opening which penetrates the alignment part and exposes at least a part of the first wiring structure, and
wherein the second alignment key overlaps the opening in the second direction and does not overlap the alignment part in the second direction.

14. The semiconductor package of claim 13,
wherein the first wiring structure includes a first wiring pattern electrically connected to the first bonding pad,
wherein the second wiring structure includes a second wiring pattern electrically connected to the second bonding pad, and
wherein the first wiring pattern and the second wiring pattern do not overlap the first alignment key and the second alignment key in the second direction.

15. The semiconductor package of claim 13, wherein the second alignment key does not include an opening inside.

16. The semiconductor package of claim 13,
wherein the first semiconductor chip further includes a first penetration electrode which penetrates the first semiconductor chip and is electrically connected to the first wiring structure, and
wherein the second semiconductor chip further includes a second penetration electrode which penetrates the second semiconductor chip and is electrically connected to the second wiring structure.

17. The semiconductor package of claim 16,
wherein the first alignment key includes a first sub-alignment key and a second sub-alignment key spaced apart from each other in the first direction, and
wherein the first penetration electrode is provided between the first sub-alignment key and the second sub-alignment key.

18. The semiconductor package of claim 16,
wherein the second alignment key includes a third sub-alignment key and a fourth sub-alignment key spaced apart from each other in the first direction, and
wherein the second penetration electrode is provided between the third sub-alignment key and the fourth sub-alignment key.

19. A semiconductor package comprising:
- a substrate which includes a first face including a connection pad, and a second face opposite to the first face in a first direction;
- a first connection terminal electrically connected to the connection pad, on the first face of the substrate;
- a first semiconductor chip which includes a first wiring structure on the second face of the substrate, the first wiring structure including a first wiring region in which a first wiring pattern is provided and a first alignment region in which the first wiring pattern is not provided, and a first penetration electrode electrically connected to the first connection terminal and the first wiring pattern;
- a first passivation layer which includes a first bonding pad provided on the first wiring pattern of the first wiring structure and electrically connected to the first wiring pattern, and a first alignment key provided on the first alignment region of the first wiring structure;
- a second passivation layer which includes a second bonding pad directly joined to the first bonding pad, and a second alignment key which does not overlap the first alignment key in the first direction, the second passivation layer being directly joined to the first passivation layer; and
- a second semiconductor chip including a second wiring structure on the second passivation layer, the second wiring structure including a second wiring region in which a second wiring pattern electrically connected to the second bonding pad is provided, and a second alignment region in which the second wiring pattern is not provided,
- wherein the second alignment key is provided on the second alignment region.

20. The semiconductor package of claim 19, wherein a spaced distance of the second alignment key from the first alignment key in a second direction different from the first direction is about 5 μm or less.

* * * * *